United States Patent
Van Houdt et al.

(10) Patent No.: US 6,246,612 B1
(45) Date of Patent: Jun. 12, 2001

(54) METHODS OF ERASING A MEMORY DEVICE AND A METHOD OF PROGRAMMING A MEMORY DEVICE FOR LOW-VOLTAGE AND LOW-POWER APPLICATIONS

(75) Inventors: Jan Van Houdt, Bekkevoort; Dirk Wellekens, Denderleeuw, both of (BE)

(73) Assignee: Interuniversitair Micro-Elektronica Centrum, vzw (IMEC vzw), Leuven (BE)

( * ) Notice: Subject to any disclaimer, the term of this patent is extended or adjusted under 35 U.S.C. 154(b) by 0 days.

(21) Appl. No.: 09/661,977

(22) Filed: Sep. 14, 2000

Related U.S. Application Data

(62) Division of application No. 09/149,723, filed on Sep. 8, 1998, now Pat. No. 6,058,043, and a division of application No. 09/505,234, filed on Feb. 16, 2000, now Pat. No. 6,144,586.
(60) Provisional application No. 60/058,279, filed on Sep. 9, 1997.

(30) Foreign Application Priority Data

May 14, 1998 (EP) .................................. 98870108

(51) Int. Cl.$^7$ .................................................. G11C 16/00
(52) U.S. Cl. ............................ 365/185.296; 365/185.14; 365/185.18; 365/185.27
(58) Field of Search .................... 365/185.29, 185.18, 365/185.27, 185.1, 185.14

(56) References Cited

U.S. PATENT DOCUMENTS

| | | | |
|---|---|---|---|
| 4,462,090 | 7/1984 | Iizuka | 365/185 |
| 4,589,009 | * 5/1986 | Motamedi | 365/185.14 |
| 4,729,115 | * 3/1988 | Kauffmann et al. | 365/185.14 |
| 5,077,691 | 12/1991 | Haddad et al. | 365/218 |
| 5,235,544 | 8/1993 | Caywood | 365/185 |
| 5,313,421 | 5/1994 | Guterman | 365/185 |
| 5,349,220 | 9/1994 | Hong | 257/322 |
| 5,467,305 | * 11/1995 | Bertin et al. | 365/185.14 |
| 5,491,657 | 2/1996 | Haddad et al. | 365/185.27 |
| 5,583,810 | 12/1996 | Van Houdt et al. | 365/185.15 |
| 5,708,588 | 1/1998 | Haddad et al. | 364/491 |
| 6,009,013 | * 12/1999 | Van Houdt et al. | 365/185.14 |
| 6,044,015 | * 3/2000 | Van Houdt et al. | 365/185.18 |
| 6,091,634 | * 7/2000 | Wong | 365/185.14 |

FOREIGN PATENT DOCUMENTS

| | | |
|---|---|---|
| 0 741 415 | 11/1996 | (EP) . |
| 0 762 429 | 3/1997 | (EP) . |

OTHER PUBLICATIONS

European Patent Office Search Report, Application No. EP 98870108.

* cited by examiner

Primary Examiner—Tan T. Nguyen
(74) Attorney, Agent, or Firm—McDonnell Boehnen Hulbert & Berghoff

(57) ABSTRACT

A method of erasing and a method of programming a nonvolatile memory cell in a chip is disclosed. Said cell comprises a semiconductor substrate including a source and a drain region and a channel therebetween, a floating gate extending over a portion of said channel, a control gate extending over another portion of the channel region, and a program gate capacitively coupled through a dielectric layer to said floating gate. The methods or schemes are using substantially the lowest possible voltage to erase a nonvolatile memory cell of the floating-gate type without having the SILC problem. Therefore, these schemes are expected to allow a further scaling of the minimum feature size of Flash memory products which is necessary for cost reduction and density increase. The present invention also aims to further decrease the voltages necessary to erase/program the memory device without degrading the corresponding performance.

6 Claims, 8 Drawing Sheets

METHODS OF ERASING A MEMORY DEVICE AND A METHOD OF PROGRAMMING A MEMORY DEVICE FOR LOW-VOLTAGE AND LOW-POWER APPLICATIONS

This is a divisional application of U.S. Patent application Ser. No. 09/149,723, filed Sep. 8, 1998, now U.S. Pat. No. 6,058,043 and a divisional application of U.S. Patent application Ser. No. 09/505,234, filed Feb. 16, 2000 now U.S. Pat. No. 6,144,586.

REFERENCE TO RELATED APPLICATIONS

This application claims priority benefits to U.S. provisional application Serial No. 60/058,279, filed on Sep. 9, 1997, and to European Patent application EP 98870108.2 filed May 14, 1998.

FIELD OF THE INVENTION

The present invention is related to methods of erasing a memory device such as a nonvolatile memory cell with a specific aim of low-voltage and low-power applications.

The present invention is also related to a method of programming a memory device such as a nonvolatile memory cell with a specific aim of low-voltage and low-power applications.

BACKGROUND OF THE INVENTION

Nowadays, most Flash memories use Channel Hot Electron Injection (CHEI) at the drain side of the memory cell, or Fowler-Nordheim Tunneling (FNT) for programming. The CHEI mechanism provides a relatively high programming speed (~10μs) at the expense of a high power consumption (~1mA/bit) which limits the number of cells that can be programmed simultaneously (so-called page-mode programming) to a maximum of 8 bytes (Y. Miyawaki et al., IEEE J. Solid-State Circuits, vol.27, p.583, 1992). Furthermore, in order to allow a further scaling of the transistor dimensions towards 0.35 μm and below, supply voltage scaling from 5V towards 3.3V and below also becomes mandatory. This supply voltage scaling is known to degrade the CHEI efficiency—and hence the corresponding programming speed-considerably, because the high power needed to trigger the CHEI can not be easily supplied on-chip from a high voltage generator or charge pumping circuit.

Fowler-Nordheim tunneling on the other hand, provides slower programming times (~100μs) and a low power consumption which allows larger pages (~4 kbit) and therefore reduces the effective programming time to 1 μs/byte (T. Tanaka et al., IEEE J. Solid-State Circuits, vol.29, p.1366, 1994). A further improvement is, however, limited by tunnel-oxide scaling limits and by the very high voltages (~18V) needed on chip for FNT, both compromising device reliability and process scalability.

The recent success of Source Side Injection (SSI) as a viable alternative over FNT and CHEI for Flash programming is mainly due to its unique combination of moderate-to-low power consumption with very high programming speed at moderate voltages. A typical example of such a device relying on SSI for programming is the Applicants' High Injection Metal-Oxide-Semiconductor or HIMOS memory cell (J. Van Houdt et al., 11th IEEE Nonvolatile Semiconductor Memory Workshop, Feb. 1991; J. Van Houdt et al., IEEE Trans. Electron Devices, vol. ED-40, p.2255, 1993). As also described in the U.S. Pat. Nos. 5,583,810 and 5,583,811, both of which are incorporated by reference, a speed-optimized implementation of the HIMOS (High Injection MOS) cell in a 0.7-μm CMOS technology exhibits a 400 nanoseconds programming time while consuming only a moderate current (~35μA/cell) from a 5V supply. This result is obtained when biasing the device at the maximum gate current, i.e. at a control-gate (CG) voltage ($V_{cg}$) of 1.5V. The corresponding cell area is in the order of 15μm² for a 0.7-μm embedded Flash memory technology when implemented in a contactless virtual ground array as described in U.S. patent application Ser. No. 08/694,812 filed on Aug. 9, 1996, which is hereby incorporated by reference. In terms of the feature size (i.e. the smallest dimension on chip for a given technology), this corresponds to ~30F² for a 0.7-μm technology.

However, due to the growing demand for higher densities, also in embedded memory applications like e.g. smart-cards and embedded microcontrollers, a continuous increase in array density and the scaling of the supply voltage become mandatory. This evolution calls for more aggressive cell area scaling and for low-voltage and low-power operation. In U.S. patent application Ser. No. 08/694,812 filed on Aug. 9, 1996, a novel programming scheme is described which reduces the power consumption during the write operation considerably. Also, the used write voltages are expected to scale with the supply voltage $V_{supply}$ since the SSI mechanism only requires the floating gate channel to stay in the linear regime for fast programming (see e.g. J. Van Houdt et al., IEEE Trans. Electron Devices, vol. ED-40, p.2255, 1993). Therefore, the necessary Program-Gate voltage $V_{pg}$ for fast programming is given by:

$$V_{pg} \sim (V_{supply} + V_{th})/p \qquad (1)$$

where $V_{th}$ is the intrinsic threshold voltage of the floating gate transistor (~0.5V) and p is the coupling ratio from Program Gate to Floating Gate (typically ~50%). According to Eq.(1), $V_{pg}$ is thus expected to scale twice as fast as the supply voltage in a first order calculation. It can be concluded that the high programming voltage is scaling very well with the supply voltage which offers enough latitude in order for the high voltage circuitry to follow the minimum design rule.

However, another problem in further Flash memory scaling is related to the erase operation. In most cases, Fowler-Nordheim tunneling through a triangular barrier is used as the erase mechanism and this requires a high oxide field (~10MV/cm). In order to establish this, the tunnel oxide has to be further scaled down if the erase voltage is to decrease with the supply voltage (as required by normal CMOS scaling rules, cf. the programming operation in the previous paragraph). Otherwise, it becomes impossible to generate and switch these high voltages on-chip. However, the tunnel oxide cannot be scaled below ~6 nm because of retention limits and, even more important, Stress-Induced Leakage Current (SILC). The latter mechanism reduces the disturb margins of the memory cells after write/erase cycling. In U.S. patent application Ser. No. 08/694,812 filed on Aug. 9, 1996, a novel erase scheme has been presented that allows the reduction of the negative erase voltage from −12V, well below −8V down to −7V for the same erase speed by exploiting the triple gate structure of the HIMOS cell. Although this novelty offers significant advantages (a 5V reduction in voltage to be switched on-chip is considerable), it may—in the long run —lead to 2 problems:

(1) Due to SILC and retention limits, the tunnel oxide may need to stay thicker than the gate oxide under the control gate at a certain point along the scaling curve. Although the HIMOS cell is less sensitive to such a situation (the read-out current is dominated by the control-gate channel), it can give rise to scaling problems due to the decreasing control over the floating gate transistor. Ideally, the oxide under the floating gate should at least follow the scaling of the gate oxide under the control gate to keep sufficient symmetry in the cell concept. Moreover, this is also beneficial for the endurance of the device: the thinner the oxide, the more cycles can be applied (apart from the SILC issue, as discussed subsequently).

(2) The larger problem, however, is the fact that the built-in select device has to endure the still relatively high negative voltage. In a 0.7-$\mu$m technology, this corresponds to −7V across a 15–17 nm oxide which is still tolerable (the associated stress is only present for a limited time equal to the erase time multiplied with the number of cycles, i.e. typically 1,000 seconds). In a 0.35-$\mu$m technology, the gate oxide is only 7 nm and the negative voltage should go down to ~-31 4V. At the same time, however, the bitline voltage has decreased from 5V to 3.3V due to supply voltage scaling, which means that the tunnel oxide cannot be scaled sufficiently to compensate for this reduction in erase voltages without entering the SILC regime. Increasing the bitline voltage internally on-chip is a possibility but it requires charge pumps in the column decoder (with a design complexity) and it compromises the scalability of the cell's channel length.

So, there is clearly a need for a new erase scheme which offers the possibility to scale down the erase voltages without having the SILC problem. Several solutions to this problem are given in this specification.

Other references to SSI devices that are relevant with respect to the present invention are listed below:

(1) U.S. Pat. No. 5,280,446, issued Jan. 18, 1994, to Y.Y. Ma et al.

(2) U.S. Pat. No. 5,029,130, issued Jul. 2, 1991, to B. Yeh (3) "An 18Mb Serial Flash EEPROM for Solid-State Disk Applications", by D.J. Lee et al., paper presented at the 1994 Symposium on VLSI Circuits, tech. digest p.59

(4) "A 5 Volt high density poly—poly erase Flash EPROM cell". by R. Kazerounian, paper presented at the 1988 International Electron Devices Meeting, tech. digest p.436.

In contrast with the invention described below, these references all suffer from a higher processing complexity and/or the need for higher erase voltages.

Ma et al. (1) use a triple poly cell where first and second poly are etched in a stacked way. It is well-known to anyone skilled in the art that such a processing scheme introduces considerable complexity which makes it impossible to use in a.o. an embedded memory application. On the other hand, the used erase voltage is still −12V provided that the bitline is biased at 5V. In future generations, aggressive tunnel oxide scaling will be required in order not to have an increase in this negative voltage.

Yeh et al. (2) show a split gate cell with very complicated interpoly formation scheme which, again, makes this concept unsuited for embedded memory. The used erase voltage is still 15V although special processing features have been introduced specifically to enhance the interpoly conduction for efficient erasure.

The papers by Lee (3) and by Kazerounian (4) show less details on processing issues but it is clear from the disclosure that the erase voltages are on the order of 20V in order to tunnel through a polyoxide.

AIMS OF THE INVENTION

It is an aim of the present invention to present novel erase methods or schemes that are using substantially the lowest possible voltage to erase a nonvolatile memory cell of the floating-gate type without having the above-mentioned SILC problem. Therefore, these schemes are expected to allow a further scaling of the minimum feature size of Flash memory products which is necessary for cost reduction and density increase.

The present invention also aims to further decrease the voltages necessary to erase/program the memory device without degrading the corresponding performance.

SUMMARY OF THE INVENTION

The present invention is related to the field of fast-programmable Flash EEPROM (Electrically Erasable Programmable Read-Only Memory) devices relying on the Source-Side Injection (SSI) mechanism for programming and suited for medium-to-high density low-voltage low-power applications.

Specifically, according to a first aspect, the present invention relates to novel low-voltage erase methods which allow low-voltage erase and programming operation on-chip in order to reduce the additional cost of incorporating the resulting Flash array in a CMOS (Complementary Metal-Oxide-Semiconductor) process flow. The methods are also relevant for so-called embedded memory applications where the Flash process modules have to be economically reconciled with an already existing CMOS baseline process for fabricating chips that contain large amounts of digital or analog functions as well as Flash memory, such as e.g. smart cards.

A nonvolatile memory cell is disclosed comprising a semiconductor substrate including a source and a drain region with a channel therebetween, a floating gate formed in a first polysilicon layer and extending over a portion of said channel with a thin insulating layer therebetween, a control gate formed in a second polysilicon layer and extending over another portion of the channel region. The nonvolatile memory cell further comprises an additional program gate being capacitively coupled through a dielectric layer to said floating gate and extending over said floating gate.

In a first aspect of the present invention, an erase method is presented which allows to reduce the erase voltage from −12V to −5V and below for a 0.35-$\mu$m CMOS technology without any erase time penalty. This low-voltage erase method allows to reduce the internally generated negative erase voltage which enhances reliability margins and which further decreases the development entry cost for implementing the HIMOS concept in an existing CMOS baseline process such as a 0.35-$\mu$m CMOS technology.

More particularly, the present invention is related to a method of erasing a nonvolatile memory cell in a chip, comprising the steps of:

applying a first negative voltage to said program gate;

applying a third negative voltage to said control gate whereby establishing an electric field between said control gate and said substrate;

said first and said third negative voltage coupling a second negative voltage to said floating gate;

applying a fourth voltage equal or higher than the supply voltage of said chip to said drain region; and applying a fifth negative voltage to the substrate, said negative voltage being large enough to reduce the electric field between the control gate and the substrate and to couple a sixth negative voltage to the floating gate, thereby enhancing the voltage across the drain-to-floating gate overlap region.

In a second aspect of the present invention, the method of erasing a nonvolatile memory in a chip, comprises the steps of:

applying a first negative voltage to the program gate; thereby coupling a second negative voltage to said floating gate;

applying a third positive voltage to the control gate; to thereby establish a relatively high electric field across the dielectric between the control gate and the floating gate, and thereby causing a tunneling current to flow from the floating gate towards the control gate in order to discharge the floating gate and therefore erase the memory cell.

Thus, the memory cell is erased without considerable power consumption and with moderate voltages only.

In a third aspect of the present invention a method of programming a nonvolatile memory cell is disclosed, the method comprising the steps of:

applying a first high voltage to said program gate thereby coupling a second high voltage to said floating gate of said cell;

applying a third low voltage equal or smaller than the threshold voltage of the control-gate channel to said control gate;

applying a fourth voltage equal or higher than the supply voltage to said drain region of said cell; and applying a fifth low negative voltage to the substrate to thereby cause a small current to flow from the source region of said cell towards the floating-gate channel of said cell while achieving programming of said memory cell.

The third low voltage can also be slightly larger than the threshold of the control gate channel.

Thus, programming of said memory cell is achieved by means of source-side injection of hot-electrons generated through primary as well as secondary impact ionization, and this without the need for an additional high supply voltage nor a high power consumption from the supply voltage.

In a fourth aspect of the present invention, a triple poly nonvolatile memory cell being based on the cell concept described in U.S. patent application Ser. No. 08/694,812 filed on Aug. 9, 1996 is also presented. This triple poly cell, for the first time, reconciles the possibility for having a small cell size with a high degree of CMOS compatibility.

Thus, a nonvolatile memory cell is disclosed comprising a semiconductor substrate including a source and a drain region with a channel therebetween, a floating gate formed in a first polysilicon layer and extending over a portion of said channel with a thin insulating layer therebetween, a control gate formed in a second polysilicon layer and extending over another portion of the channel region. The nonvolatile memory cell further comprises an additional program gate formed in a third polysilicon layer being capacitively coupled through a dielectric layer to said floating gate and extending over said floating gate.

Thus, the present invention in this aspect, aims to reach a very compact, though still CMOS-compatible, cell geometry that paves the way to even higher density low-voltage applications. This geometry is fully compatible with the above-mentioned low-voltage erase schemes.

The term "supply voltage", is well understood by one of ordinary skill in the art. The term "supply voltage" is meant to be any external voltage that delivers the power to make an electronic circuit operate. By preference, the "supply voltage" of a chip including nonvolatile memory cells is the voltage used to supply the power to any logic circuit fabricated in the CMOS technology in which the nonvolatile memory cells are incorporated. For the 0.7 $\mu$m nonvolatile memory technology as disclosed in this and related applications, the supply voltage is 5 Volts. Any externally applied voltage other than the supply voltage defined above will be referred to herein simply as an "external voltage".

A voltage that is outside the range between the supply voltage and ground and that only needs to deliver a limited amount of current can be generated without the need for an external voltage. Such voltage is referred to as an on-chip generated voltage and can be generated by charge pumps incorporated on the chip.

In the specification, the terms low voltage, moderate voltage and high voltage are also used. A low voltage is meant to be a voltage that in absolute value is lower than or equal to the supply voltage ($|V| \leq Vcc$). A moderate voltage is a voltage that in absolute value is higher than or equal to the supply voltage but is smaller than or equal to the double of the supply voltage ($Vcc \leq |V| \leq 2Vcc$). A high voltage is a voltage that in absolute value is higher than $2Vcc$ ($|V| \leq 2Vcc$).

The objects, features, and advantages of the present invention, are discussed or apparent in the following description.

BRIEF DESCRIPTION OF THE DRAWINGS

The present invention will be described in detail with reference to the following drawings, which describe several preferred embodiments of the present invention:

FIGS. 1–9 are compatible with this device structure as well as with the device structure disclosed in U.S. Pat. No. 5,583,810.

DETAILED DESCRIPTION OF THE PREFERRED EMBODIMENTS

Figure 1:
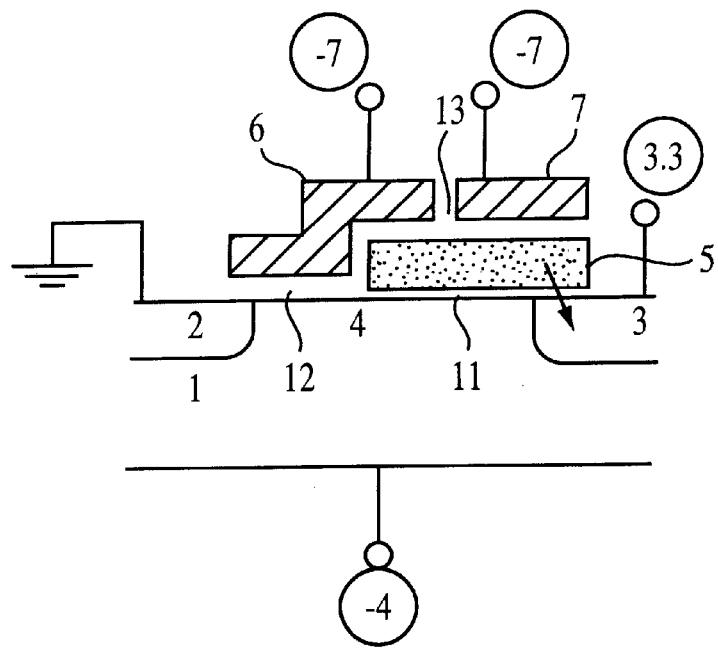
FIG. 1 shows a cross-section of a memory cell and an erase method according to the invention which allows a reduction of the negative erase voltage and which removes the reliability problem associated with the stress in the control-gate oxide.

Exemplary devices have been fabricated in a 0.7 μm nonvolatile technology embedded in a CMOS technology and represented on FIGS. 1, 2, 4, and 6. On these schematic cross-sections, each time a substrate (1), a source region (2), a drain region (3), and a channel region (4) are represented. In these examples of FIGS. 1, 2, 4, and 6, the substrate is p-type doped. Further is shown a floating gate (5), a control gate (6) and a program gate (7). In a preferred embodiment of the invention, the program gate (7) is to be separated in space from the control gate. In FIG. 1, exemplary voltages applied on the source region (2), the drain region (3) and the substrate (1) are 0V, +3.3V, and –4V respectively, while –7V is applied both to the control gate (6) and the program gate (7). Such voltages are applied on the different parts of the memory cell. These voltages are indicated as circled numbers above or below a vertical line.

According to other embodiments, the source region can also be Vcc or floating.

Figure 2:
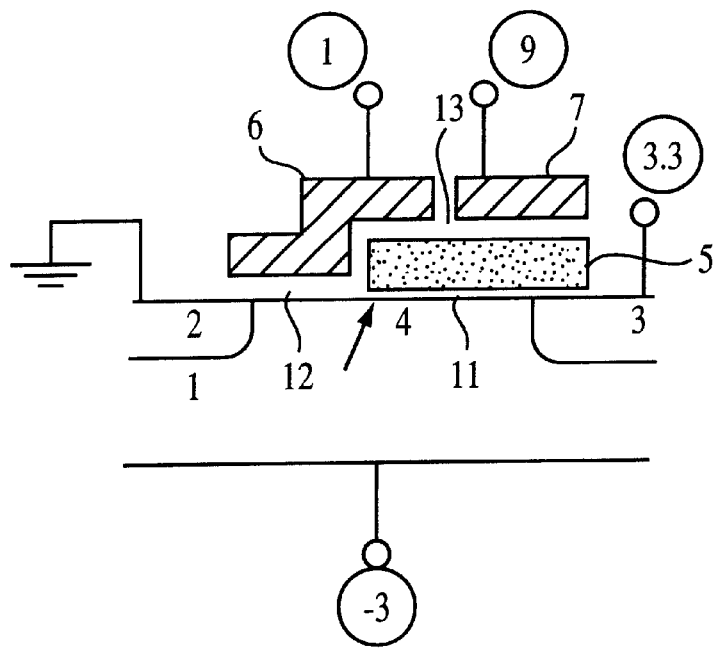
FIG. 2 shows a cross-section of a memory cell and a novel programming scheme which enhances the injection efficiency of the source-side hot-electron injection mechanism thereby allowing a further reduction of the programming voltage.

In FIG. 2, exemplary voltages applied to the source region (2), the drain region (3) and the substrate (1) are 0V, +3.3V and –3V, respectively, while +1V and +9V are applied to the control gate (6) and the program gate (7), respectively.

Figure 4:
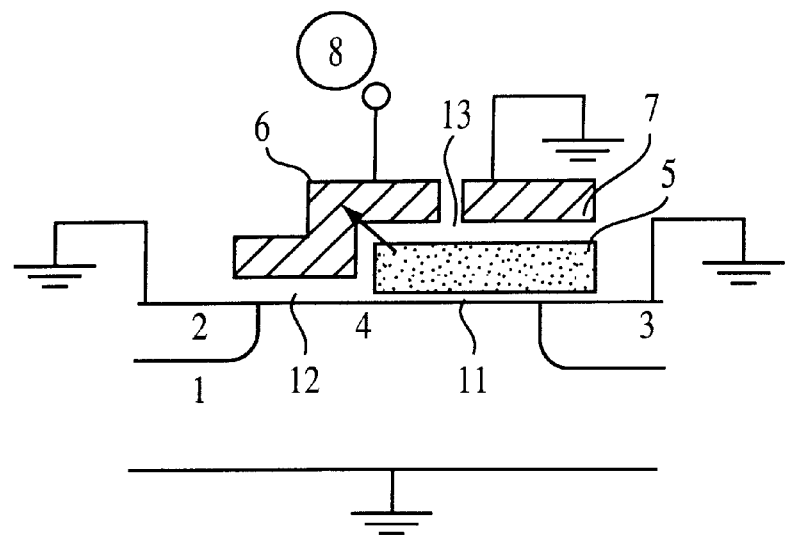
FIG. 4 shows an erase scheme which uses polyoxide tunneling from the floating gate towards the control gate.

In FIG. 4, exemplary voltages applied to the source region (2), the drain region (3) and the substrate (1) are all connected to the ground potential while the control gate voltage (6) has a value of +8V and the program gate (7) is also connected to ground potential.

Figure 6:
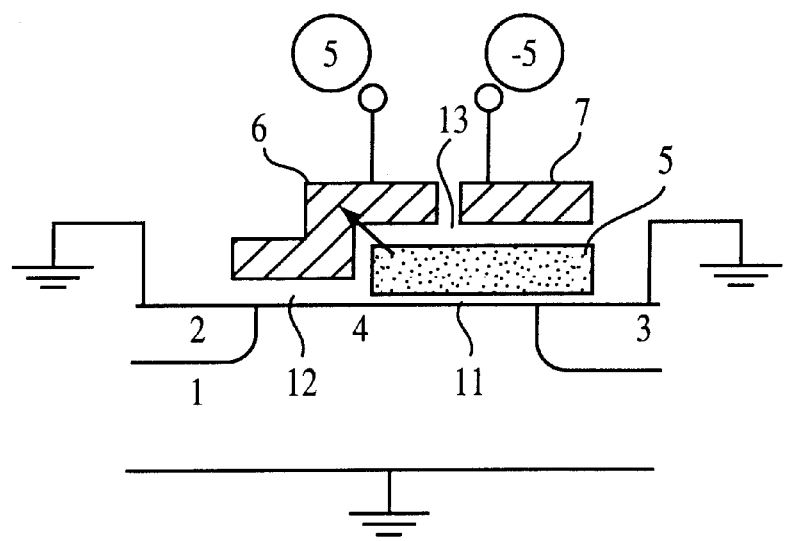
FIG. 6 shows an erase scheme which allows to reduce the erase voltages to $|5V|$ and even below. This polyoxide erase scheme uses low negative voltages on the Program Gate in order to remove the stress on the control-gate transistor without causing any penalty from the point of view of erase speed nor cycling endurance.

In FIG. 6, ground potential is applied to the source region (2), the drain region (3) as well as to the substrate (1) while the control gate (6) and the program gate (7) are biased at +5V and –5V, respectively.

These exemplary devices have a thin oxide (11) (7–9 nm) under the floating gate (5). The interpoly dielectric (13) is a polyoxide of thickness 25–30 nm, and the oxide (12) between the control gate and the channel region is 15 nm. The length of the floating gate (5) is 0.7 μm, the length of the control gate (6) is 1.0 μm, and the overall size is 13–15 μm².

The several methods as disclosed in the present application can also be applied to a 1.25 μm nonvolatile technology stand alone or embedded in a CMOS technology or in a 0.35 μm or smaller gate length nonvolatile technology stand alone or embedded in a CMOS technology.

1. Low voltage erase scheme based on Fowler-Nordheim tunneling

An important feature of this invention is a novel erase scheme that allows to reduce considerably the negative gate bias necessary for Flash erase. Especially for embedded memory applications where the minimization of the impact of the memory technology on the surrounding CMOS circuits is a prime issue, the reduction of the negative erase voltage is of major importance. Furthermore, a voltage reduction also simplifies the design of the high voltage generating and switching circuitry, and increases reliability margins for the entire process. Referring to FIGS. 12 and 17 in U.S. patent application Ser. No. 08/694,812 filed on Aug. 9, 1996, the application of a negative voltage to both control gate(CG) and program gate(PG) already allows a considerable reduction in necessary erase voltage. However, as already mentioned above in the prior art section, when control gate oxides (12) scale down towards 7 nm and below, this erase scheme may not be further scalable towards the 0.25-μm generation because of the stress associated with the—still fairly high—negative voltage on the control gate. To remove this problem, a compensating smaller negative voltage can be applied at the substrate of the cell as shown in FIG. 1. This offers 2 advantages:

(1) the voltage across the control gate oxide (12) is only equal to the difference between the negative erase voltage and the bulk voltage. The latter can thus be adjusted in order to obtain proper margins for process reliability.

(2) also, the negative voltage at the bulk side (1) of the cell will be partially coupled towards the floating gate (5) which further enhances the electric field across the floating-gate-to-drain overlap region where tunneling is to be established.

In this case, the voltage across the tunnel oxide (11) between the FG and the drain is approximately given by the following equation:

$$|V_{fg} - V_d| \approx p(V_t - V_g) + (1-d)V_d - c\, V_g - s\, V_b \quad (2)$$

where p, c, d and s are the PG-to-FG, the CG-to-FG, the drain-to-FG and the bulk-to-FG capacitive coupling ratio's, respectively. Typical values are p=50%, c=20%, s=15% and d=10%. Vg represents the (common) gate voltage applied to both gates, $V_{fg}$ and $V_d$ are the FG voltage and the drain voltage during erasure, respectively, $V_t$ is the threshold voltage of the memory cell measured from the PG and $V_b$ is the applied negative bulk voltage. Taking typical values for the parameters into account ($V_d$ 5V, $V_t$ varies between 2V and –4V) it can be calculated that, in order to obtain a reasonable erase time in the order of milliseconds, a PG voltage of –7V is typically required for a state-of-the-art tunnel oxide of 8 nm if no bulk voltage is applied. In order to generate this high negative voltage on-chip and to switch it onto the PG during the Flash erase operation, an even higher voltage in the order of –10V has to be generated locally inside the charge pump.

As compared to Eq.(4) in U.S. patent application Ser. No. 08/694,812 filed on Aug. 9, 1996, it is clear that the additional term $sV_b$ (indicated in Eq. (2) in bold font) will further increase the oxide field independently of the value of the threshold voltage of the cell. This allows to use a lower voltage of ∼–5.5V at the gate for the same erase speed as can be calculated from Eq.(2). Moreover, due to this smaller erase voltage, and due to the distribution of the different voltages contributing to the tunneling field across the entire device structure, the electric field inside the cell is nowhere large except at the FG-to-drain overlap where tunneling is required. Therefore, the necessary reliability margins are much easier to accomplish than in the case where the bulk voltage is not present. If erase speed is not an issue, as in e.g. EPROM replacement applications, the erase voltage can even be allowed to decrease further to –5V.

It has already been demonstrated and explained in U.S. patent application Ser. No. 08/694,812 filed on Aug. 9, 1996 that the erase scheme with a negative voltage applied to both external gates exhibits a peculiar relationship between erase speed and PG coupling ratio: the erase speed increases with decreasing coupling capacitance, and hence with decreasing cell area. This is a remarkable property since the smaller the cell, the faster it erases, in contrast to all other erase schemes known in the prior art. It makes device design much easier since the optimum coupling ratio for programming is never compromised by erase speed requirements. Also, this erase scheme is clearly interesting for scaled-down Flash memories. Repeating the same arguments that have been displayed in U.S. patent application Ser. No. 08/694,812 filed on Aug. 9, 1996, it can be easily demonstrated that this result holds for the novel scheme of FIG. 1. Due to the fact that the contributions of the negative control gate and bulk voltages are adding up to the field independently of the charge on the floating gate (FG), the phenomenon described above will even be enhanced, i.e. the influence of the PG coupling ratio on erase speed will become even less important.

The additional bulk voltage will not compromise the complexity of the array operation. Since in the case of Flash memories, an entire sector is erased at once, the sector can simply coincide with all cells connected to the same negative bulk voltage. Moreover, even if the substrates of the different sectors would be connected (e.g. by placing these in a common p-well), the disturb effect introduced by the bulk voltage would be negligible.

2. Low voltage programing scheme based on Secondary Impact Ionization Enhanced Source Side Injection Applying a negative bias to the substrate (1) of the memory cell during programming shows a further increase in injection efficiency with respect to the conventional programming scheme as described in U.S. Pat. No. 5,583, 810. FIG. 2 shows this programming scheme, and FIG. 3 shows the corresponding gate currents measured at the floating gate of the memory cell as a function of the control-gate voltage.

Figure 3:
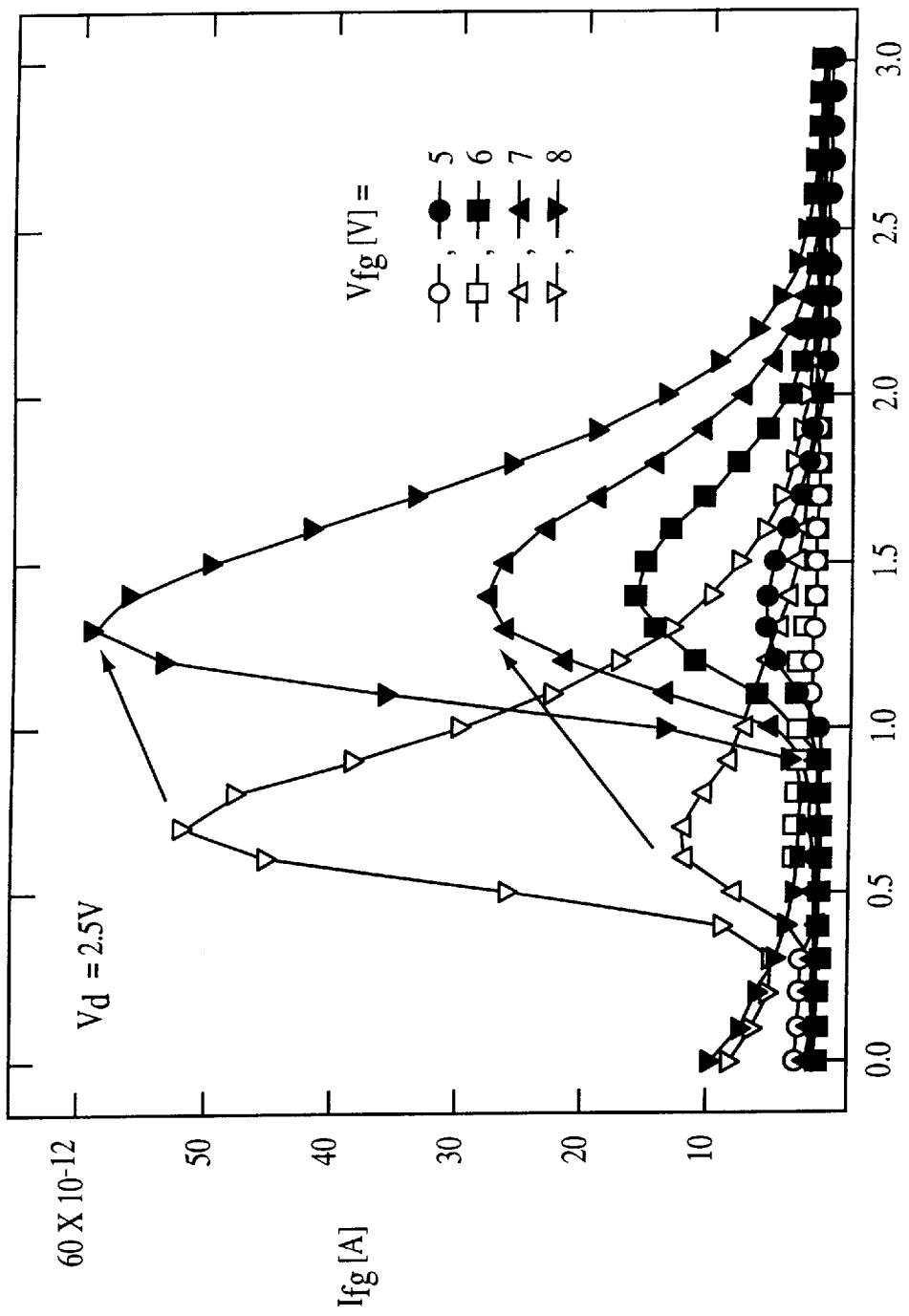
FIG. 3 compares the gate currents measured at the (contacted) floating gate for the 'traditional' SSI case and for the modified programming scheme schematically shown in FIG. 2. Open symbols are for $V_b=0V$; closed symbols are for $V_b=-3V$. $V_b$ is the applied bulk voltage.

From FIG. 3, it is clear that the injection is increased by applying a negative bulk bias of −3V. The gain in injection current is determined by several factors:

(1) the technology generation (the effect is becoming strongly significant from 0.35-$\mu$m CMOS on).
(2) the drain voltage (the effect becomes visible when the drain voltage or the voltage supply is scaled to 2.5V and below)
(3) the gate voltage (the gain is larger as the floating gate voltage decreases).

This can be explained from secondary impact ionization effects in the bulk of the device: if the drain-bulk junction is biased considerably higher than the drain-source voltage (in the present case 5.5V as compared to 2.5V), the influence of secondary impact ionization becomes considerable. On the other hand, it is known that this secondary impact ionization requires high doping levels and/or thin gate oxides to become significant and these conditions are only reached in deep-submicron technologies. Finally, at lower floating-gate voltages, the direct injection due to primary impact ionization (the conventional SSI current) is decreasing rapidly due to the saturation of the floating-gate transistor. As a consequence, the injection due to secondary impact ionization becomes relatively more important. Although the gain in injection current due to the bulk bias is still small for a 0.35-$\mu$m technology, it is expected to become larger and larger with device scaling. The interesting point is that the available potential drop for hot electron generation is now determined by the sum of 2 voltages: the bulk bias and the drain bias. This makes it possible to further scale down the channel length since the latter is limited by the drain voltage only.

From a practical point of view, the implementation of the secondary impact ionization enhanced SSI mechanism requires no additional processing nor design efforts, especially if the bulk bias is also applied in the erase mode as described in FIG. 1. In the latter case, the necessary technology and circuits are already provided to switch, e.g. −3V, on the substrate or bulk during erasing. The fact that Flash memories require byte-selective programming (in contrast to the erase operation which is performed in sectors) is not an issue because the low bulk bias is not able to alter the content of the non-addressed cells. In other words, there is no reason to decouple the bulk potential of addressed and non-addressed cells which means that the switching circuitry can be kept identical for both programming and erasing.

3. Low voltage erase scheme based on polyoxide conduction

Figure 5:
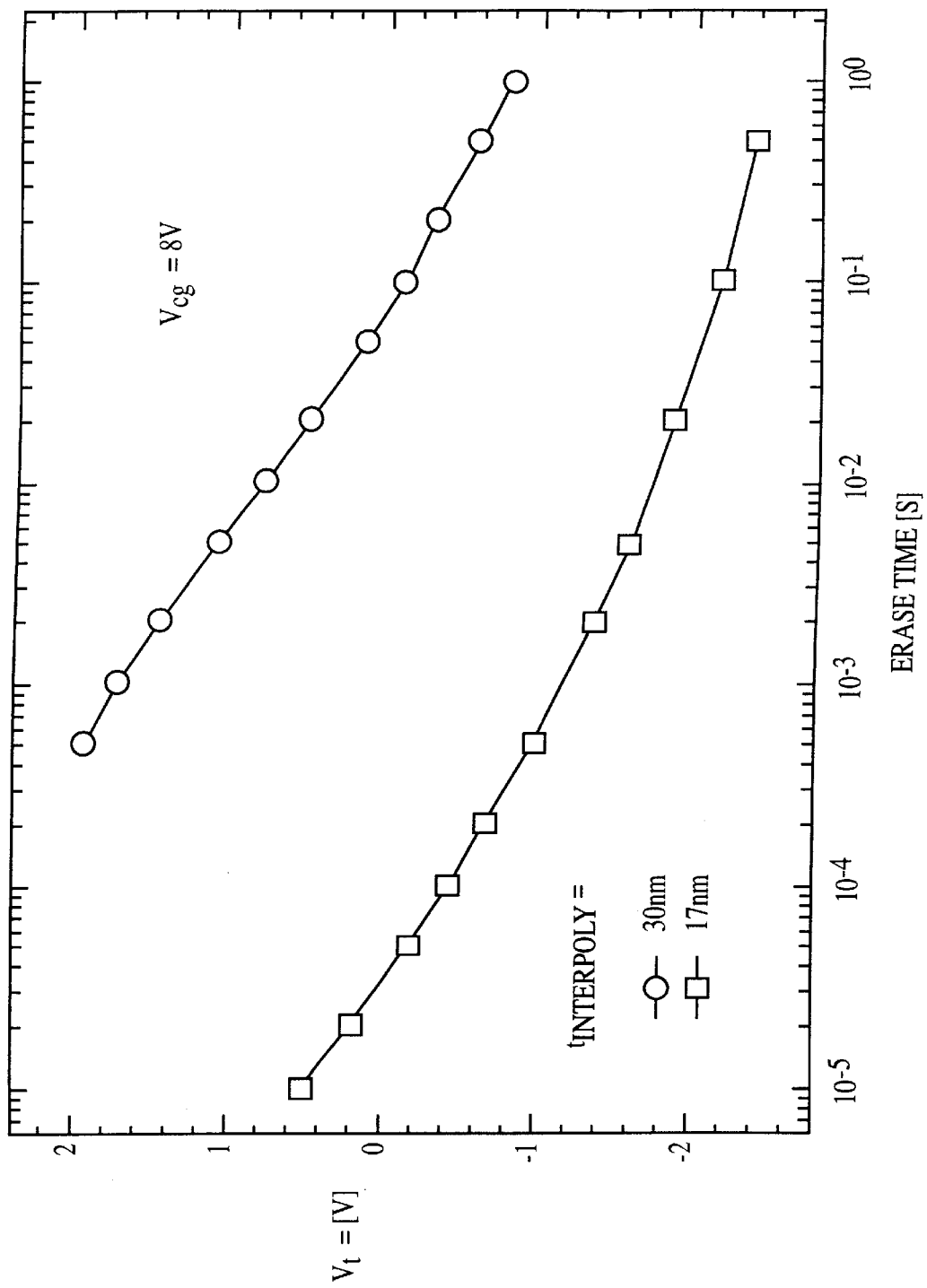
FIG. 5 shows the erase characteristics according to the scheme of FIG. 4. Due to the small coupling ratio between these respective gates, the cell can already be overerased to a negative threshold voltage using only 8V at the control gate.

FIG. 4 illustrates this erase scheme when applied to a HIMOS cell. In the Applicants' U.S. Pat. No. 5,583,810, it has already been disclosed that the HIMOS+n cell can be erased by applying a high positive bias to the control gate (see FIG. 12 in that patent where 10–14V is applied for a 1.25-$\mu$m CMOS technology). Similar characteristics for scaled-down technologies, i.e. a 0.7-$\mu$m CMOS technology with a 30 nm interpoly oxide (13) and a 0.5-$\mu$m technology with a 17 nm interpoly oxide (13), are shown in FIG. 5. It is clear from this Figure that the cell can be erased to negative threshold voltages using about 8V on the control gate. A very large speed improvement is observed if the interpoly oxide is scaled below 20 nm. This is in contrast to the results presented by Yeh et al. where a thick (~100 nm) oxide is used for high reliability and the conduction is enhanced by a dedicated processing scheme which forms an injector at the floating gate edge. These complicated processing steps are completely avoided in the current invention which allows also to reduce the erase voltage considerably: in the Yeh patent a 15V gate voltage is mentioned as typical value for erasing. In fact, the paper "A novel 3 volts-only, small sector erase, high density Flash $E^2$PROM" presented by S. Kianian at the 1994 Symposium on VLSI Technology (same device as in the Yeh patent, assigned to Silicon Storage Technology, Sunnyvale, Calif.) also mentions a 14V erase voltage to be applied to the wordline to erase the cell. Moreover, the referred device also requires 11V on the source line during programming which makes the design much more difficult due to the presence of charge pumps in the column decoder.

In contrast to this device known in the prior art, the HIMOS cell only uses a simple processing scheme wherein the gate oxide under the control gate is grown directly in combination with a thin polyoxide which is used for tunneling in the erase mode. This offers 3 major advantages over the prior art:

(1) no additional processing steps are needed for interpoly dielectric formation which lowers processing cost considerably with respect to the prior art
(2) the gate oxide under the control gate can be scaled down in relation to the CMOS scaling which implies that the high read-out current is maintained, also in future generations.
(3) the erase voltages used are very low in comparison with the prior art.

Figure 7:
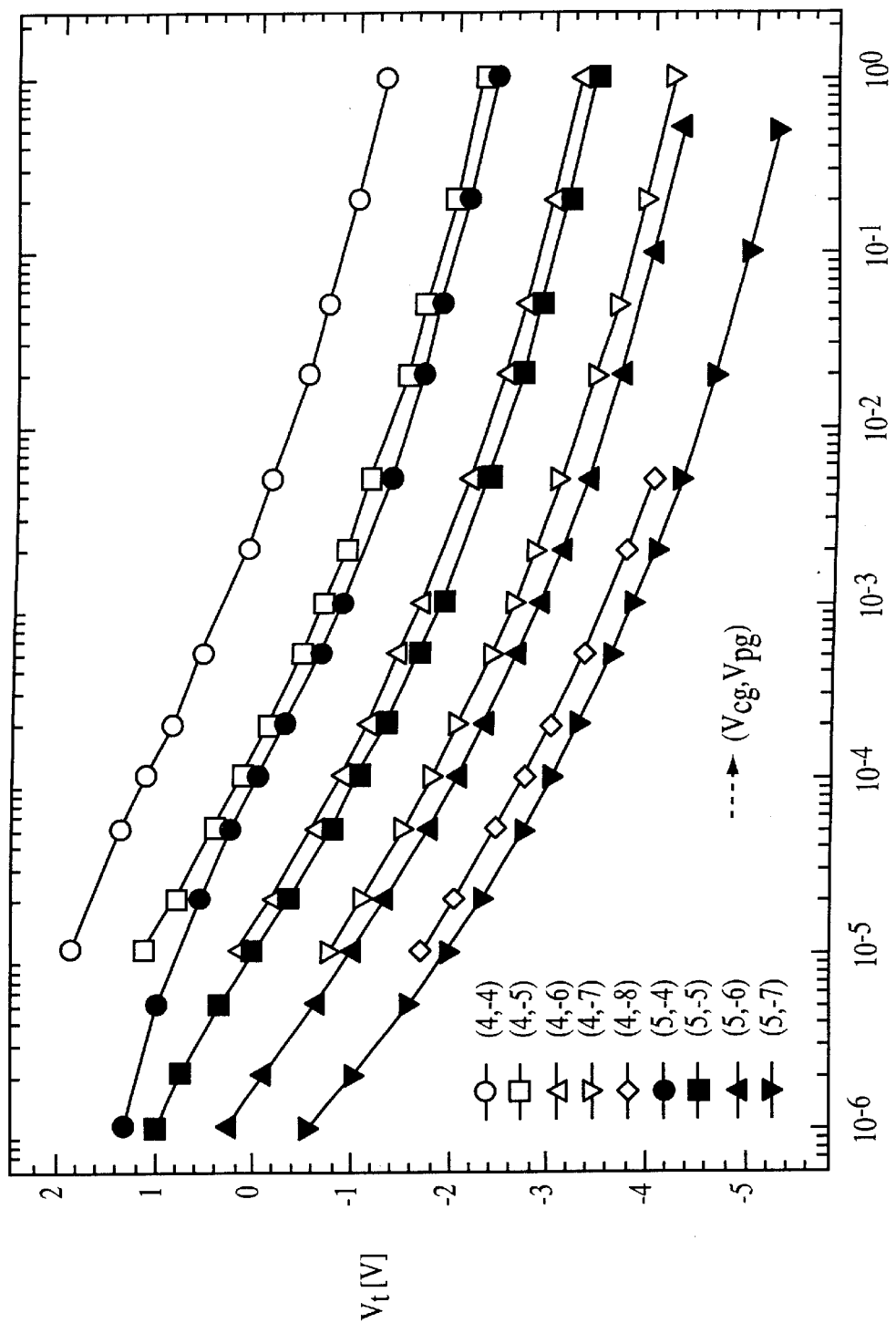
FIG. 7 shows the erase characteristics for the scheme of FIG. 6 as measured on memory cells fabricated in a 0.35-$\mu$m CMOS technology.

However, as a consequence of this oxidation scheme, the control gate transistor has 8V at its gate in the case of FIG. 4. For a 15–17 nm gate oxide (12) (0.7-$\mu$m technology), this can be tolerated. However, when scaling down to less than 10 nm, an additional reliability problem arises. To avoid this, the unique triple gate structure of the HIMOS cell can be exploited as indicated in FIG. 6: due to the presence of a third (program) gate (7), the possibility exists to replace the high control gate voltage by a combination of a moderate positive voltage at the control gate and moderate negative voltage at the Program Gate (7) in order to establish the same interpoly oxide field. The experimental results for a 17 nm polyoxide layer (13) are shown in FIG. 7. It is clear that the cell can already be erased to a negative threshold voltage of −3V using voltages as low as +5V at the CG and −5V at the PG. The advantages of such a scheme are:

(1) the possibility to erase with the smallest possible voltages (typically Vcg=5 and Vpg=5V without any process optimization) as compared to the prior art.

(2) the gate oxide under the control gate can be scaled down easily in order to maintain a high read-out current (3) the high voltage switching circuitry becomes a lot smaller (4) the high voltage processing module becomes much easier to implement (5) the polyoxide conduction mechanism consumes virtually no power (apart from the tunneling current itself) because all bitlines are grounded.

More specifically, the following disadvantages of the Fowler-Nordheim mechanism are removed in this scheme:

(1) the presence of |Vg|+Vd across the oxide which is grown on the bitline (see e.g. the contactless arrays described in U.S. patent application Ser. No. 08/694,812 filed on Aug. 9, 1996 is avoided: the largest voltage difference inside the array in the new erase scheme is only |Vg| or typically 5V instead of 12V in the old erase scheme as described in U.S. patent application Ser. No. 08/694,812 filed on Aug. 9, 1996.

(2) the sector size has a lower limit due to the large and cumbersome negative voltage switches and, eventually, due to the need to bias the bulk of the cell (see above). In the present case, however, the minimum sector size becomes equal to a wordline which is the theoretical minimum.

(3) the FN case requires triple well technology in deep-submicron generations in order to be able to transport the high negative voltages on chip. For polyoxide erase, this requirement is largely relaxed which offers the possibility to implement this in a conventional twin well process. This is beneficial for processing cost.

(4) The Stress Induced Leakage Current: in poly erase schemes, the SILC is simply non-existent since the stress induced by programming and erasing now corresponds to a much lower oxide field which is not able to generate SILC traps. Further reduction of the oxide thickness under the floating gate becomes a viable way to improve the number of cycles.

(5) In the FN case, the bitline voltage also decreases with scaling and therefore, the negative erase voltage does not have the tendency to scale with the CMOS generation. This can hardly be solved by aggressive tunnel oxide scaling nor by bitline charge pumps. In the poly erase scheme, this problem is removed: the necessary erase voltages at the gates are no longer a function of the supply voltage.

(6) In the FN case, inhibit voltages are required in the non-addressed sectors during the sector erase operation. This is due to the fact that the presence of the bitline voltage (Vsupply) can cause a slow erase operation in a certain sector every time another sector is being erased. This is a direct consequence of the absence of a select transistor in Flash arrays. These inhibit voltages and the associated circuitry are no longer necessary in the case of the presented polyoxide erase operation since no bitline voltage is applied anywhere inside the array.

(7) Using FN, the positive as well as the negative voltages are to be applied to the WordLine WL (connected to the control gates of a row of cells, see e.g U.S. patent application Ser. No. 08/694,812 filed on Aug. 9, 1996) and to the ProgramLine PL. This implies a complication in the row decoder which has to pass 0V on the PL during read-out and 0V on the unselected WL's during read-out as well as during programming. Because of the negative voltage during erase, a pMOS device has to be provided in the row decoder which is unable to pass a perfect zero potential. Therefore, a small negative charge pumping circuit is required in the row decoder which increases the decoder size and the power consumption during read-out. This problem is almost entirely solved by using only negative voltages at the PL. The threshold-voltage window of the cell can even be adjusted in such a way that this complication is also removed in the programming regime.

Figure 8:
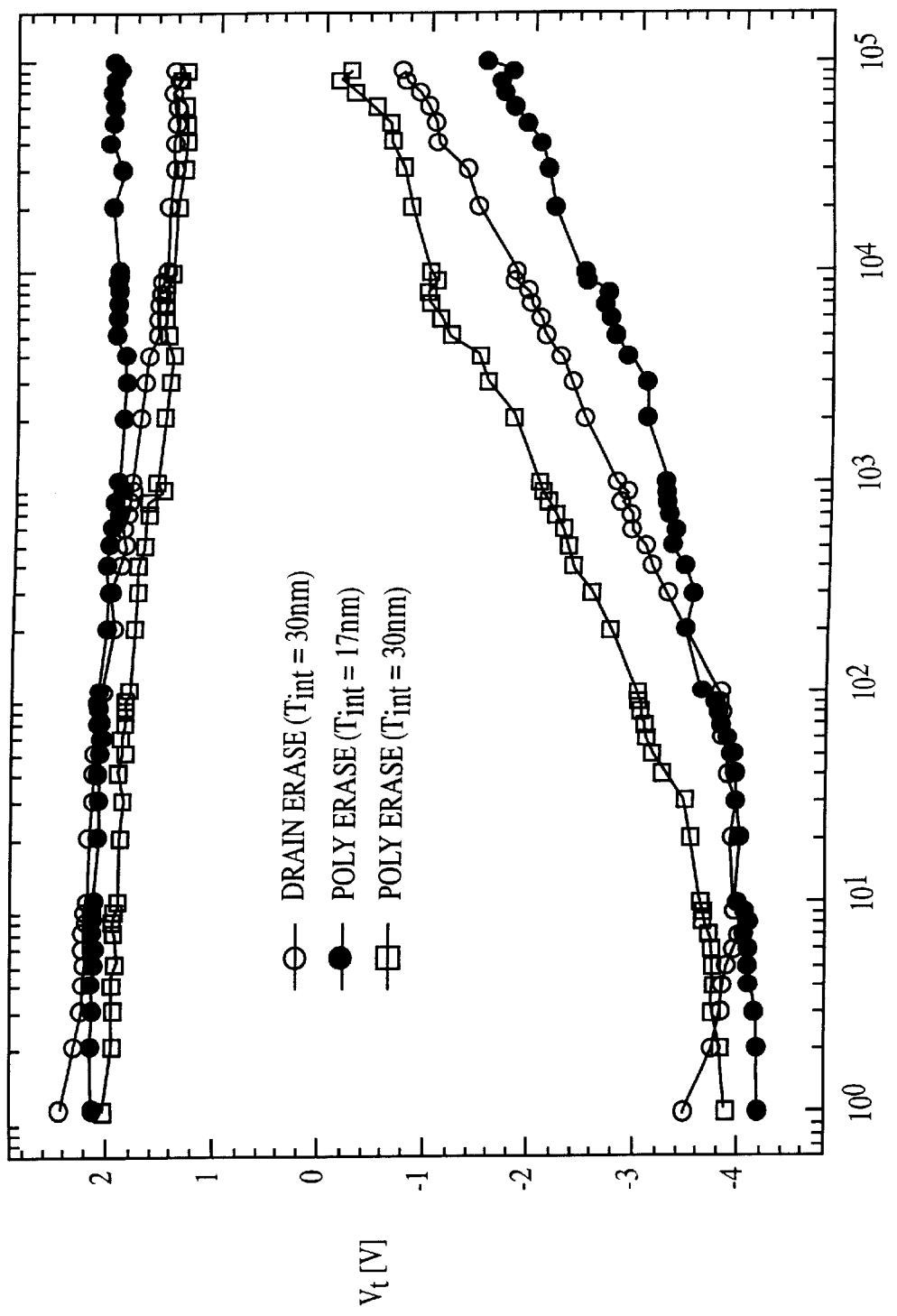
FIG. 8 shows the endurance characteristics as measured on cells from a 0.35-μm CMOS technology.

The endurance characteristics for the polyoxide erase case are compared to the conventional Fowler-Nordheim case (drain erase) in FIG. 8. The drain erase case is still better than the polyoxide erase option for a 30 nm interpoly oxide. However, when scaling the interpoly layer down to only 17 nm, the poly erase case becomes considerably better than the drain erase case. These tests were performed on identical devices (apart from the interpoly oxide layer) and with identical programming conditions, and, therefore, prove that the polyoxide erase option is becoming better than the tunneling towards the drain, unlike in former technology generations. For the example shown in FIG. 8, it is concluded that—for a given read-out current—the number of cycles can be increased from 10,000 to 100,000 by choosing the presented erase scheme using a 17 nm polyoxide on top of the floating gate.

Figure 9:
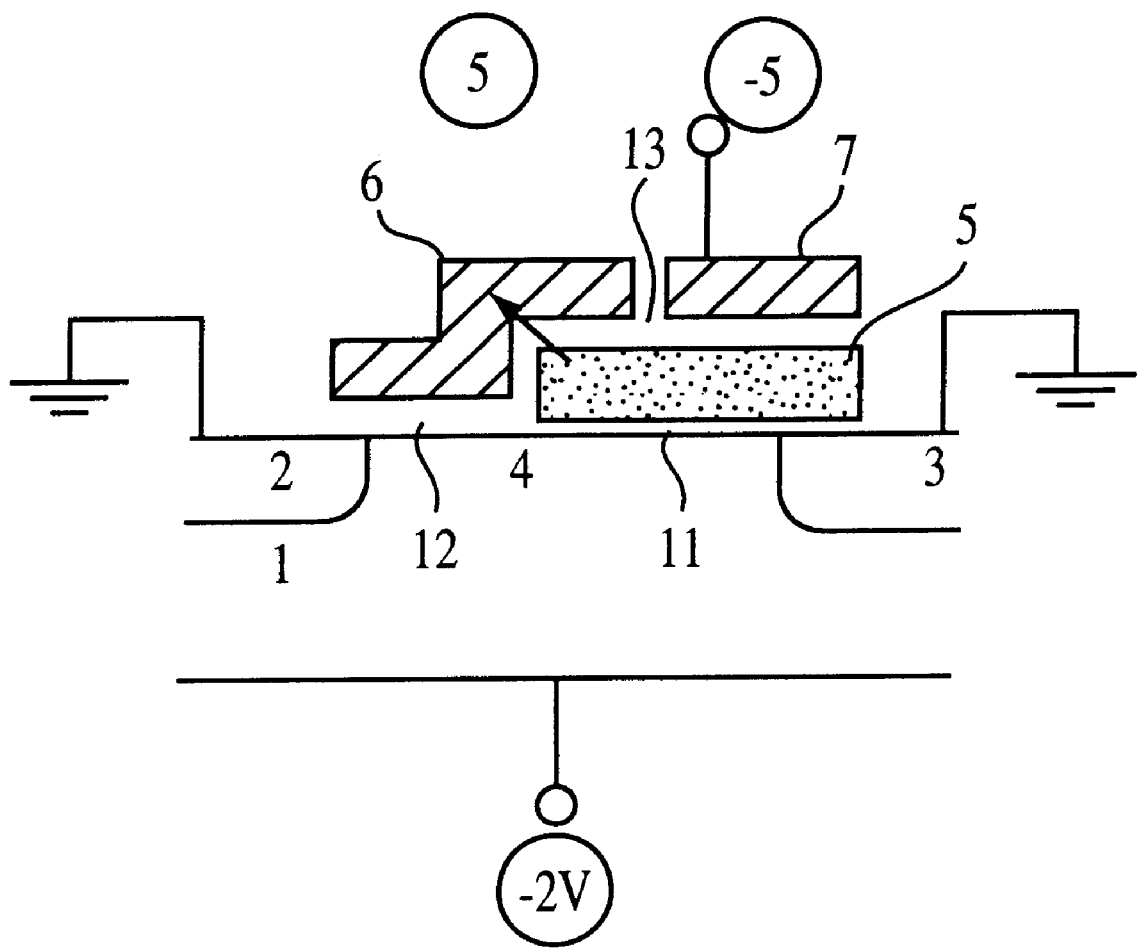
FIG. 9 shows the novel erase scheme of FIG. 6 where also a bulk voltage is applied for further enhancing the oxide field during erasure.

Finally, the presented erase scheme can eventually be combined with a negative bulk bias, much in the same way as described in the first section (see FIG. 9). The additional voltage which is then coupled from the substrate towards the floating gate helps to erase the device with even lower gate voltages. In this case, the bulk bias is, however, limited to low voltage values because it adds up with the control gate voltage as far as the stress on the select transistor is concerned.

4. Novel cell structure with three polysilicon layers

As mentioned in the prior art section, the HIMOS cell takes at least about $30F^2$ in a 0.7-$\mu$m double polysilicon CMOS process. This is larger than state-of-the-art stand-alone memory technologies. In order to meet the increasing demand for high density embedded as well as stand-alone memories, another cell geometry may be required. The main reason for this larger cell size is the need to form two gates in the same polysilicon layer, i.e. the control gate and the program gate. These two gates have laterally isolated edges which increase the cell size considerably with respect to other cell concepts that only use 2 gates (1 floating gate and 1 control gate) at the expense of a lower performance. Secondly, the double polysilicon version suffers from a severe technological problem when scaling down to very thin gate oxides: the second polysilicon layer has to be overetched in order to remove the stringers that would otherwise stay behind at the edges of the first polysilicon layer. For very thin gate oxides, this becomes harder and harder to do since the overetch step has to stop on this thin oxide in order not to damage the silicon surface. This problem is a direct consequence of the two gates inside the cell which are to be formed in the same polysilicon layer. The problem can be removed by adding a third mask to selectively remove these stringers, but this introduces an additional processing cost. Therefore, a triple polysilicon version becomes highly attractive since a higher density is obtained and the stringer problem is removed automatically.

Figure 10:
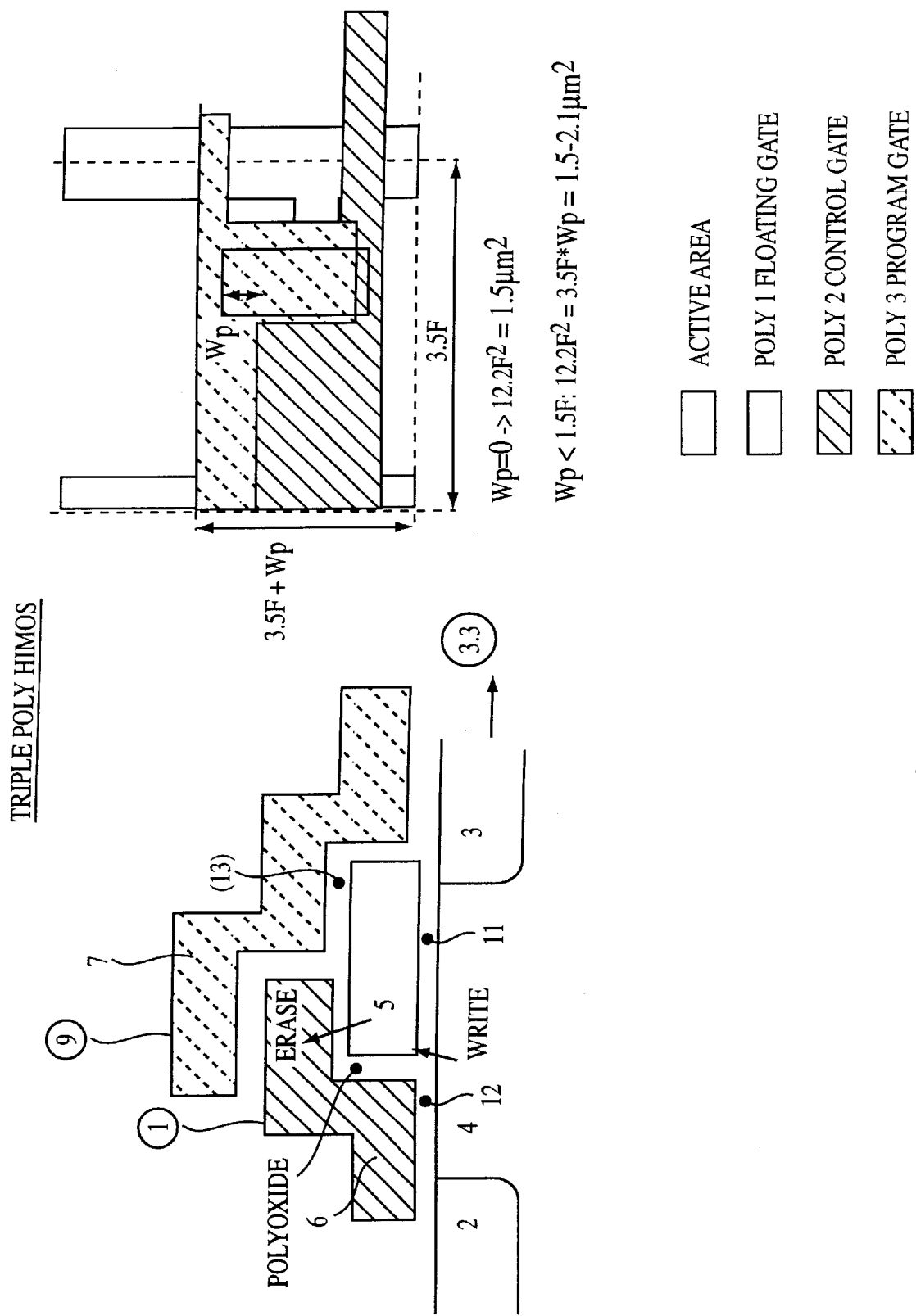
FIG. 10 shows alternative cell geometry employing 3 layers of polysilicon which enables a considerable reduction of the cell size down to 15F². All erase and programming schemes shown in the other

FIG. 10 shows such a high density concept which is basically the same as the concept described in Applicants' U.S. Pat. No. 5,583,811, from the point of view of memory operation. From the structural point of view, however, this cell is considerably smaller since the program gate (7) is now formed in a third polysilicon layer and placed on top of the split-gate transistor which removes the above-mentioned area penalty. If we start from the assumption that a third poly mask is necessary anyway (even if only 2 polysilicon layers are being used, see above), the additional cost for processing the device of FIG. 10 is relatively small:

(1) a second interpoly insulating layer between second and third poly is to be introduced, preferably a high quality composite ONO layer (13), which has to isolate the high programming voltage from the split-gate structure.

(2) a 3rd polysilicon layer has to be introduced.

In contrast to earlier attempts (e.g. Ma et al.), the presented solution is staying close to the original double polysilicon version as described in Applicants' U.S. Pat. No. 5,583,811, without however excluding any of the operational modes described in Applicants' U.S. Pat. No. 5,583,810, nor in U.S. patent application Ser. No. 08/694,812 filed on Aug. 9, 1996.

The first polysilicon layer is used for the floating gate (5) and is isolated from the substrate through a thin insulating layer (11), e.g. an oxide (typically 7 nm in a 0.35-μm CMOS process). The second poly serves as the control gate (6) and is isolated from the substrate by a thin insulating layer (12), e.g. oxide which is grown at the same time as the interpoly oxide (13) which is present between the floating gate (5) and the control gate (6). This cell can still be erased through FN tunnelling or through polyoxide conduction as described above. The third poly is added to be able to put the Program Gate (7) on top of the split-gate structure instead of beside it. Typical programming voltages in a 0.35 μm technology are also indicated: the control gate bias is around 1V, while the program gate is provided with 8–9V from a charge pumping circuit. The drain (3) is biased at 3.3V, which is the supply voltage. This brings the floating gate to a potential of about 4V which is sufficient to efficiently trigger the SSI mechanism. During erase, gates are biased negatively (around −6V) while the drain (3) is at 3.3V in case of the drain erase scheme. For the polyoxide erase scheme, 5V is applied to the CG (6) and −5V or −4V to the PG (7) while the bitlines are kept grounded. Read-out is accomplished by applying small voltages at CG (6) and drain (3) while the PG (7) is grounded.

Preferred embodiments of the present invention have been described herein. It is to be understood, however, that changes and modifications can be made without departing from the true scope and spirit of the present invention. The true scope and spirit of the present invention are defined by the following claims, to be interpreted in light of the foregoing specification.

What is claimed is:

1. A method of erasing a nonvolatile memory cell in a chip, said cell comprising a semiconductor substrate including a source and a drain region and a channel therebetween, a floating gate extending over a portion of said channel, further referred to as the floating-gate channel, a control gate extending over another portion of the channel region, further referred to as the control-gate channel, and an additional program gate capacitively coupled through a dielectric layer to said floating gate, said method comprising the steps of:

applying a first negative voltage to the program gate; thereby coupling a second negative voltage to said floating gate; and applying a third positive voltage to the control gate; to thereby establish a high electric field across the dielectric between the control gate and the floating gate, and to thereby cause a tunneling current to flow from the floating gate towards the control gate.

2. The method as recited in claim 1, wherein the first voltage is a moderate negative voltage.

3. The method as recited in claim 1, wherein the first voltage is an on-chip generated negative voltage.

4. The method as recited in claim 1, wherein the third voltage is a moderate positive voltage.

5. The method as recited in claim 1, further comprising the step of:

applying a fourth negative voltage to the substrate to thereby further decrease the floating gate potential towards more negative values.

6. The method as recited in claim 1, wherein the fourth voltage is a small negative voltage.

* * * * *